(12) United States Patent
Frohberg et al.

(10) Patent No.: US 7,763,532 B2
(45) Date of Patent: Jul. 27, 2010

(54) TECHNIQUE FOR FORMING A DIELECTRIC ETCH STOP LAYER ABOVE A STRUCTURE INCLUDING CLOSELY SPACED LINES

(75) Inventors: Kai Frohberg, Meissen (DE); Matthias Schaller, Dresden (DE); Roberto Klinger, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 862 days.

(21) Appl. No.: 11/145,905

(22) Filed: Jun. 6, 2005

(65) Prior Publication Data

US 2006/0094215 A1 May 4, 2006

(30) Foreign Application Priority Data

Oct. 29, 2004  (DE) .................. 10 2004 052 577

(51) Int. Cl.
*H01L 21/3205* (2006.01)
*H01L 21/4763* (2006.01)
*H01L 21/44* (2006.01)

(52) U.S. Cl. .................. 438/592; 438/595; 438/682

(58) Field of Classification Search .................. 438/303
See application file for complete search history.

(56) References Cited

U.S. PATENT DOCUMENTS

| | | | |
|---|---|---|---|
| 5,672,544 A | 9/1997 | Pan | 437/200 |
| 6,670,278 B2* | 12/2003 | Li et al. | 438/710 |
| 6,806,187 B2* | 10/2004 | Graettinger et al. | 438/675 |
| 6,905,922 B2* | 6/2005 | Lin et al. | 438/199 |
| 2002/0127763 A1 | 9/2002 | Arafa et al. | 438/76 |
| 2003/0073277 A1* | 4/2003 | Cho et al. | 438/211 |
| 2004/0132274 A1* | 7/2004 | Jun et al. | 438/592 |
| 2006/0024879 A1* | 2/2006 | Fu et al. | 438/216 |

* cited by examiner

*Primary Examiner*—Ha Tran T Nguyen
*Assistant Examiner*—Valerie Brown
(74) *Attorney, Agent, or Firm*—Williams, Morgan & Amerson, P.C.

(57) ABSTRACT

When forming line structures of semiconductor devices in accordance with the 90 nm technology, sidewall spacers of the lines are reduced in size immediately prior to the deposition of an etch stop layer that is formed on the device layer. Due to the reduced spacer elements or due to a complete removal of the spacer elements, the subsequent deposition of the etch stop layer and of the interlayer dielectric is significantly enhanced with respect to void formation and defect rate.

31 Claims, 3 Drawing Sheets

TECHNIQUE FOR FORMING A DIELECTRIC ETCH STOP LAYER ABOVE A STRUCTURE INCLUDING CLOSELY SPACED LINES

BACKGROUND OF THE INVENTION

1. Field of the Invention

Generally, the present invention relates to the formation of integrated circuits, and, more particularly, to the formation of a dielectric interlayer between and over circuit elements including closely spaced lines, such as gate electrodes, polysilicon interconnect lines and the like.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, MOS technology based on silicon is currently the most promising approach due to the superior characteristics in view of operating speed and/or power consumption and/or cost effectiveness. During the fabrication of complex integrated circuits using MOS technology, millions of transistors, i.e., N-channel transistors and/or P-channel transistors, are formed on a substrate including a crystalline silicon layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region. The conductivity of the channel region, i.e., the drive current capability of the conductive channel, is controlled by a gate electrode that comprises a line-like portion and is formed above the channel region and separated therefrom by a thin insulating layer.

Typically, the circuit elements, such as the MOS transistors, capacitors, resistors and the like, are formed in a common layer, which will be referred to hereinafter as a device layer, whereas the "wiring," i.e., the electrical connection of circuit elements according to the circuit design, may be accomplished only to a certain degree by means of polysilicon lines and the like within the device layer so that one or more additional "wiring" layers formed over the device layer may be required. These wiring layers include metal lines embedded into an appropriate dielectric material, such as silicon dioxide, silicon nitride and the like, or, in very advanced devices, low-k materials having a permittivity of 3.5 or less are used. The metal lines and the surrounding dielectric material will be referred to hereinafter as a metallization layer. Between two adjacent metallization layers, and also between the device layer and the first metallization layer, respective dielectric interlayers are formed, through which metal-filled openings are formed to establish the electrical connection between metal lines or between circuit elements and metal lines. In typical applications, the dielectric interlayer separating the device layer from the first metallization layer is essentially formed from silicon dioxide that is deposited above a dielectric etch stop layer by well-established plasma enhanced chemical vapor deposition (PECVD) techniques, which enable the formation of a smooth and dense silicon dioxide film with sufficient conformality at moderately high deposition rates. Upon further device scaling resulting in gate lengths of MOS transistors on the order of 50 nm or even less, the distances between neighboring circuit elements, such as polysilicon lines, gate electrodes and the like, are also reduced and have now reached, in modern CPUs, approximately 250 nm and less, which translates into approximately 100 nm or less for the space width between the dense polysilicon lines. It turns out, however, that the gap-fill capabilities of well-established high rate plasma enhanced CVD techniques for the deposition of silicon nitride, which is frequently used as the material for the etch stop layer, and silicon dioxide, which is often used as the interlayer dielectric, may no longer suffice to reliably form a dielectric interlayer, as will be described in more detail with reference to FIG. 1.

In FIG. 1, a semiconductor device 100 comprises a substrate 101 that may be a bulk silicon substrate or a silicon-on-insulator (SOI) substrate having formed thereon a device layer 102 including, for instance, a silicon layer 110 having formed thereon a structure 103 that may comprise closely spaced polysilicon lines 104. Hence, the device layer 102 may represent a substantially crystalline silicon region in which and on which circuit elements, such as field effect transistors, capacitors and the like, are formed. The structure 103 may represent an area having a plurality of dense polysilicon lines, or the lines 104 may represent portions of gate electrodes of transistor elements. The lines 104 may have formed on sidewalls thereof corresponding spacer elements 105, as are typically used for forming gate electrode structures. The spacer elements 105 may include a plurality of spacers, such as an offset spacer 113 and a liner 112, wherein, typically, the liner 112 and the bulk portion of the spacer 105 are made of different materials. An etch stop layer 109, typically comprised of silicon nitride, is formed over the device layer 102 to cover the layer 110 and the line structure 103. A silicon dioxide layer 107 is formed above the etch stop layer 109 to completely enclose the line structure 103.

A typical conventional process flow for forming the device 100 as shown in FIG. 1 may include the following processes. After fabrication processes to form circuit elements, such as transistors, capacitors and the line structure 103, which include well-established lithography, deposition, etch, implantation and other techniques, the etch stop layer 109 is formed, typically by plasma enhanced chemical vapor deposition (PECVD), since PECVD of silicon nitride may be accomplished at moderately low temperatures of less than approximately 600° C., which is compatible with preceding manufacturing processes and materials, such as metal silicides and the like. As previously discussed, the ongoing shrinkage of feature sizes also entails that a distance between neighboring circuit elements, such as a distance 111 between the closely spaced lines 104, is reduced and may be as low as approximately 100 nm in the 130 nm technology, whereas the distance 111 may be as small as 30 nm and even less for currently manufactured CPUs of the 90 nm technology node. Hence, any deposition techniques for forming a dielectric layer for embedding the line structure 103 with open spaces therebetween have to meet the requirements of an appropriate fill capability to reliably and completely fill the empty spaces between the densely spaced lines 104. By means of well-established PECVD process recipes for silicon nitride, the layer 109 may be deposited in a more or less conformal fashion with a thickness in the range of approximately 10-80 nm. However, owing to the reduced distance 111, the well-established deposition recipes used in the 130 nm technology may not result in a defect-free deposition of the etch stop layer 109 and may instead create voids 106a.

Thereafter, the silicon dioxide layer 107 is deposited, which is typically done by PECVD on the basis of precursors TEOS (tetra-ethyl-ortho-silicate) and oxygen, since PECVD, contrary to thermal TEOS CVD, allows the deposition of silicon dioxide in a moderately conformal manner (yet with significantly less gap filling qualities compared to thermal CVD) with relatively high mechanical stability at temperatures below 600° C. at high deposition rates, which provides a high production yield. Moreover, PECVD cluster tools are readily available so that the silicon nitride layer 109 and the PECVD silicon dioxide layer 107 may be deposited in a highly efficient manner.

However, with the distance 111 approaching approximately 30 nm and even less, it turns out that the fill capabilities of well-established PECVD techniques for depositing silicon dioxide on the basis of TEOS and oxygen may not be adequate to completely fill the empty spaces between the lines 104, thereby possibly creating voids 106b, which may, in combination with the voids 106a that may have been created in preceding deposition step(s), lead to severe reliability concerns during the further processing of the semiconductor device 100. Moreover, it should be noted that the silicon dioxide layer 107 has a certain topography caused by the underlying structure of the device layer 102, for instance, by the line structure 103, which may jeopardize subsequent manufacturing processes, such as a photolithography step for forming contact openings to underlying portions of circuit elements located in the layer 110 or on the lines 104. Consequently, a standard process flow requires that the silicon dioxide layer 107 be planarized, typically by chemical mechanical polishing (CMP), wherein excess material of the silicon dioxide layer 107 is removed by chemical and mechanical interaction with a slurry and a polishing pad to finally obtain a substantially planarized surface of the silicon dioxide layer 107. The CMP process itself is a highly complex process and requires sophisticated process recipes, which significantly depend on the characteristics of the silicon dioxide layer 107, such as density, mechanical stress, water contents and the like. Hence, a great deal of effort has been made for the 130 nm technology to develop corresponding process recipes for reliable and reproducible CMP processes for PECVD TEOS silicon dioxide, as this material is frequently used for a dielectric interlayer in silicon-based semiconductor devices and even in devices formed from other semiconductors. As previously noted, the transition to the 90 nm technology may render these process recipes inappropriate due to the insufficient gap fill capabilities.

For this reason, the dielectric layer 107 formed on the silicon nitride layer 109 may be deposited by a different deposition technique having a significantly enhanced gap filling capability to avoid at least the creation of the voids 106b. Hence, the silicon dioxide layer 107 may be formed by a thermal CVD process on the basis of TEOS and ozone, which generates a silicon dioxide film exhibiting excellent gap filling capabilities, that is, this deposition technique provides excellent conformality, and may even display a "flow"-like behavior, thereby allowing reliable filling of the empty spaces between the lines 104. In view of the film characteristics, the thermal CVD process is typically performed at significantly higher pressures compared to the plasma enhanced deposition technique, for example in the range of 200-760 Torrs, and is therefore denoted as "sub-atmospheric CVD" (SACVD). Another deposition technique for silicon dioxide is the plasma enhanced deposition in which a high density plasma is used, thereby also achieving excellent conformality and gap-filling capabilities. After the formation of the silicon dioxide layer 107 in accordance with one of these two deposition techniques, further processing may be continued as is described with reference to FIG. 1. That is, the silicon dioxide layer 107 is planarized by CMP. Despite the superior gap filling capabilities of the SACVD and the high density plasma (HDP) CVD, it turns out that the very different film characteristics of the silicon dioxide layer compared to the PECVD film require completely new CMP and substrate handling strategies and may also bring about a significant reduction in production yield due to reduced deposition rates, particularly when the SACVD technique is employed.

In view of the problems identified above, there exists a need for an efficient technique for forming a dielectric interlayer for the first metallization layer, especially for devices having empty spaces between densely formed lines of approximately 100 nm or less.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of an etch stop layer and a dielectric interlayer above the device layer of a semiconductor device for densely spaced line structures by well-established CVD techniques, and which provides the potential for further device scaling without the requirement of laborious adaptation of deposition and CMP processes. For this purpose, the sidewall spacers formed on sidewalls of the dense lines are reduced prior to the deposition of the etch stop layer, thereby significantly relaxing the constraints for the subsequent etch stop layer deposition, since the effective spacing between the lines "seen" by the deposition process is significantly increased. The material removal prior to the deposition of the etch stop layer and the deposition of the interlayer dielectric may, in one embodiment, be achieved by a plasma etch process on the basis of a recipe having a moderately high selectivity with respect to the material in the closely spaced lines.

According to another illustrative embodiment of the present invention, a method comprises forming a structure with a first line with a first spacer element formed on a sidewall thereof and a second line with a second spacer element formed on a sidewall thereof, wherein the first and second spacer elements face each other. Furthermore, a metal-containing region of increased conductivity is formed on each of the lines. Then, material is removed from the first and second spacer elements to increase the spacing and thereafter an etch stop layer is deposited above the structure. In one particular embodiment, the spacing defined between the first and second spacer elements is less than approximately 100 nm.

According to yet another illustrative embodiment of the present invention, a method comprises forming a structure with a first line having a first spacer element formed on a sidewall thereof and with a second line having a second spacer element formed on a sidewall thereof, wherein the first and second spacer elements face each other and define a spacing therebetween. Additionally, a metal-containing region of increased conductivity is formed in each of the lines and material is removed from the first and second spacer elements to increase the spacing by means of a selective etch process, which has a higher removal rate for the spacer material compared to the metal-containing region. Finally, an etch stop layer is deposited above the structure.

BRIEF DESCRIPTION OF THE DRAWINGS

The invention may be understood by reference to the following description taken in conjunction with the accompanying drawings, in which like reference numerals identify like elements, and in which.

Figure 1:
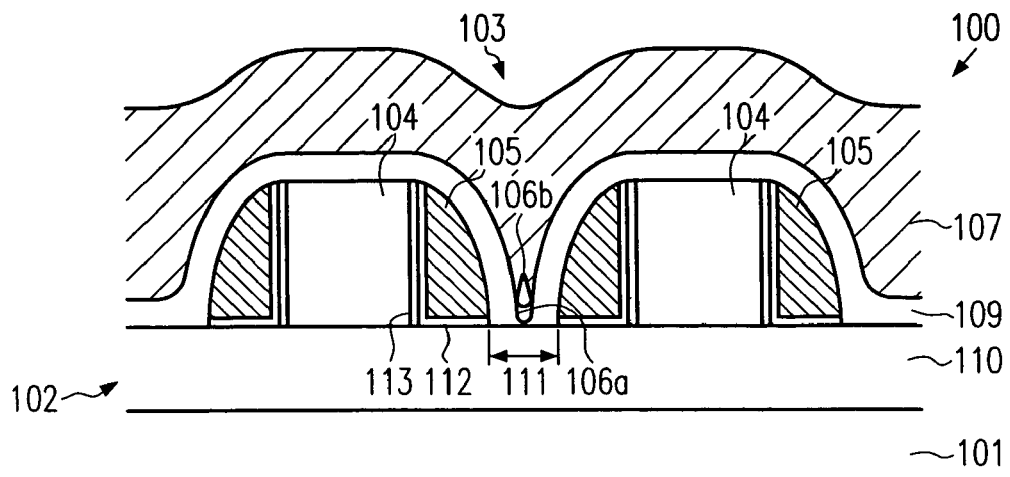
FIG. 1 schematically shows a semiconductor device including closely spaced lines during the formation of a dielectric interlayer for the first metallization layer in accordance with well-established conventional PECVD deposition techniques.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention addresses the problem of void formation during the deposition of an etch stop layer and an interlayer dielectric over the device layer of a semiconductor structure, in that spacer elements, typically formed on lines within the device layer, such as polysilicon lines, gate electrodes and the like, are at least reduced once the masking effect of the sidewall spacers is no longer required for the further manufacturing processes. Thus, after implantation cycles during which the sidewall spacers may be required as implantation masks, and after the formation of metal-containing regions within the polysilicon lines by silicidation, during which the sidewall spacer elements act as a mask for substantially preventing the formation of conductive compounds thereon, the spacer elements may be removed or significantly reduced in size to reduce the constraints for a subsequent deposition process, in that a width of the spacing between closely spaced polysilicon lines is significantly enlarged. Consequently, the subsequent deposition process for forming the etch stop layer may result in a significantly higher reliability with respect to any void formation and may also form the basis for a more reliable deposition of an interlayer dielectric. In some aspects of the present invention, the efficiency of the partial or complete spacer removal may even be enhanced in that a deposition process of enhanced gap fill capabilities may be used during the deposition of the interlayer dielectric to even more reliably prevent the creation of voids within the interlayer dielectric after the substantially void-free deposition of the etch stop layer. In these embodiments, it is particularly advantageous to provide the interlayer dielectric in the form of silicon dioxide with a first layer having improved gap fill capabilities and with a second layer providing the desired mechanical characteristics. Thereby, well-established deposition techniques, such as plasma enhanced chemical vapor deposition (PECVD) on the basis of TEOS may be used, whereas, for example, sub-atmospheric chemical vapor deposition (SACVD) on the basis of TEOS may provide a "flow-like" deposition behavior, thereby "leveling," to a certain degree, the structure including the closely spaced lines having formed thereon a substantially void-free etch stop layer. Subsequently, the bulk material of the silicon dioxide interlayer dielectric may be deposited by high yield TEOS CVD techniques.

In other embodiments, the spacer elements may be reduced in size twice, thereby providing the potential for relaxing the constraints with respect to selectivity of the etch process in removing material from the spacer elements immediately prior to the deposition of the etch stop layer. Moreover, performance gain may be achieved by individually adapting the spacer size at individual process steps. For instance, the function of an implantation mask and a reaction mask of the spacer elements may require two different spacer sizes so that, after the ion implantation, the spacer size may be reduced to be more optimally adapted to the subsequent formation of metal-containing regions within the closely spaced lines, thereby also providing the possibility of more efficiently reducing the spacer size immediately prior to the deposition of the etch stop layer.

Figure 2A:
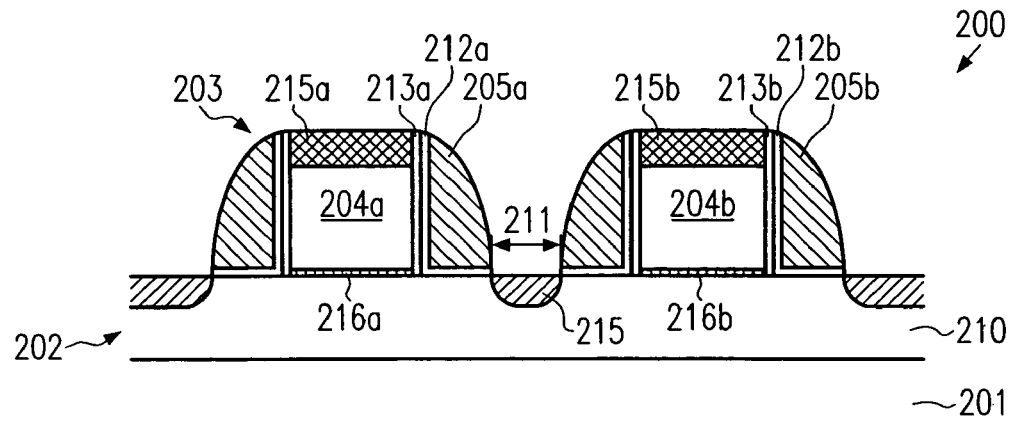
FIGS. 2a-2d schematically show a semiconductor device during various manufacturing stages in forming an etch stop layer and a dielectric interlayer in accordance with illustrative embodiments of the present invention.

With reference to FIGS. 2a-2d, 3 and 4a-4c, these and other illustrative embodiments of the present invention will now be described in more detail. FIG. 2a schematically shows a cross-sectional view of a semiconductor device 200 comprising a substrate 201, which may be any appropriate semiconductor bulk substrate, such as a silicon substrate, or which may be an insulating substrate having formed thereon a crystalline semiconductor layer. In particular, the substrate 201 may represent a silicon-on-insulator (SOI) substrate, as sophisticated integrated circuits are increasingly produced as silicon-based SOI devices. The substrate 201 comprises a device layer 202, which may include a substantially crystalline semiconductor layer 210 in and on which circuit elements, such as transistors, capacitors and the like, are formed. The device layer 202 further comprises a structure 203 formed above the semiconductor layer 210, which includes at least a first line 204a and a second line 204b. The first and second lines 204a, 204b and any components related thereto are assumed to be substantially identical and therefore these components will be described with reference to the first line 204a and corresponding components for the second line 204b are referenced by the same reference numerals except for a "b" instead of an "a." Formed on sidewalls of the first line 204a is a spacer element 205a, which may be separated from the line 204a by a further spacer, here referred to as offset spacer 213a, and a liner 212a. Moreover, a metal-containing region 215a is formed on the line 204a and may include a metal silicide, as the line 204a may typically be formed of polysilicon in advanced integrated circuits manufactured on the basis of silicon. Moreover, a thin insulation layer 216a may typically be formed between the crystalline semiconductor layer 210 and the line 204a. In particular embodiments, the insulation layer 216a may represent a gate insulation layer and the line 204a may represent the gate electrode of a field effect transistor.

As illustrated, the respective spacer elements 205a, 205b facing each other may define a spacing therebetween defined by a distance 211, which may be defined as the distance between the foot portions of the respective spacer elements 205a, 205b. In integrated circuits manufactured in accordance with the 90 nm technology, that is, the dimension of a line and a corresponding space in a substantially periodic pattern of circuit features of minimum design dimensions is 90 nm, the distance 211 may have a design value of 30 nm or even less, if transistor structures or polysilicon line structures with increased spacer thicknesses are considered. It should be appreciated that the value of 30 nm for the distance 211 relates to the design value and corresponding fluctuations may occur in actual devices due to process tolerances. As previously stated, the transition from the 130 nm technology, giving approximately 100 nm for the distance 211, to the 90 nm technology results in significant reliability problems in filling the spacing defined by the distance 211 for a value of less than 100 nm and especially for 30 nm and less, which may be accounted for by reducing the size of the spacer elements 205a and 205b, as will be described later on in more detail.

Moreover, the device 200 may comprise a metal-containing region of increased conductivity 215, i.e., a metal silicide layer formed above a source/drain region, formed between the first and second lines 204a, 204b, wherein the dimension is substantially determined by the distance 211. It should be appreciated, however, that, in other configurations, the spacer elements 205a, 205b may substantially overlap so that the resulting distance 211 is substantially zero. In this case, the region 215 may not be required.

A typical process flow for the semiconductor device 200 as shown in FIG. 2a may substantially comprise the same processes as previously described with reference to FIG. 1. That is, after forming a thin insulation layer by deposition and/or oxidation and after deposition of a material layer for the closely spaced lines 204a, 204b, a corresponding advanced patterning process may be performed to obtain the lines 204a and 204b. Thereafter, the offset spacers 213a, 213b may be formed by deposition and etch techniques, after which implantation sequences may follow. Thereafter, the spacers 205a, 205b including the liners 212a, 212b may be formed by deposition and anisotropic etch techniques, after which further implantation sequences may be performed. Anneal processes are performed to activate dopants and re-crystallize implantation-induced damage. Thereafter, the metal-containing regions 215a, 215b and possibly 215 may be formed by depositing a refractory metal and initiating a chemical reaction with the underlying semiconductor material, in the present example silicon or polysilicon, wherein the spacers 205a, 205b act as a reaction mask.

Figure 2B:
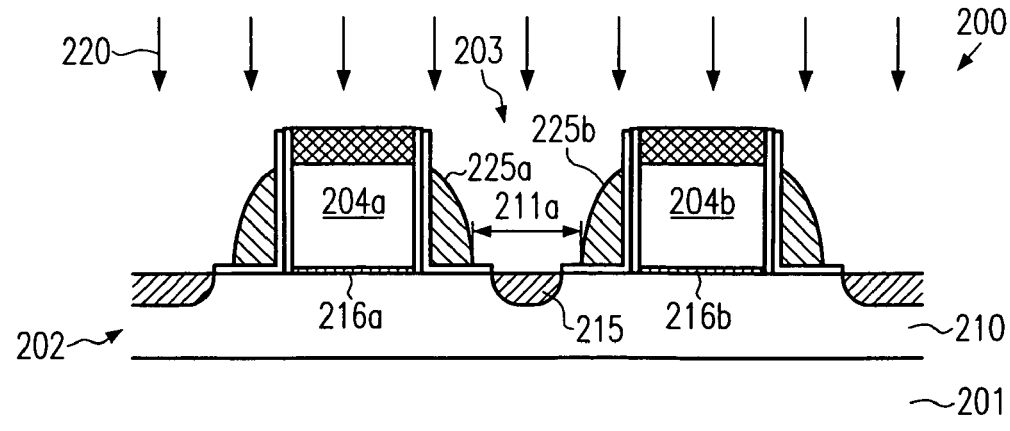

FIG. 2b schematically shows the semiconductor device 200 in a further advanced manufacturing stage, wherein the device 200 is subjected to an etch process 220 for removing material of the spacer elements 205a, 205b to reduce the size thereof. The spacers of reduced size in FIG. 2b are indicated as 225a and 225b. Due to the spacer elements 225a, 225b of reduced size, the distance 211 is also increased and is now indicated as 211a. In particular embodiments, the reduced spacer elements 225a, 225b have dimensions to provide the distance 211a with a magnitude that is comparable with respective dimensions in the 130 nm technology mode. Thus, in these illustrative embodiments, the distance 211a may have a magnitude on the order of 100 nm. In other embodiments, the reduced spacers 225a, 225b have dimensions which result in approximately 70 nm or more for the distance 211a. In other illustrative embodiments of the present invention, the spacer elements 205a, 205b (FIG. 2a) may substantially be removed, wherein, depending on the etch recipe used for the process 220, the liner 212a, 212b and the offset spacers 213a, 213b may or may not be removed.

The etch process 220 may, in some embodiments, be designed to exhibit a selectivity between the material of the spacers 205a, 205b and the metal-containing regions 215a, 215b, thereby causing only insignificant material removal in these metal-containing regions, while significantly removing material from the spacers 205a, 205b, thereby resulting in the reduced spacers 225a, 225b or in a substantially complete removal of the spacers 205a, 205b. In one particular embodiment, the etch process 220 may be designed as a plasma etch process on the basis of an etch chemistry including carbon monoxide (CO), a carbon/hydrogen/fluorine (CHF) compound and oxygen. The carbon/hydrogen/fluorine compound may be represented by $CH_3F$. In principle, any appropriate plasma etch tool may be used for the etch process 220 as long as an appropriate plasma atmosphere may be established therein. In one embodiment, the plasma etch process 220 may be performed in a TEL DRM UNITY 2e etch tool, which may be used with the following parameter ranges. The plasma power may be adjusted to approximately 220-270 W, for instance approximately 250 W, and the chamber pressure may be adjusted to approximately 30-50 mT, for instance approximately 40 mT. The etch chemistry may be established within the plasma atmosphere on the basis of carbon monoxide with a flow rate of approximately 20-40 sccm (standard cubic centimeter per minute), for instance approximately 30 sccm, with a flow rate for $CH_3F$ of approximately 20-40 sccm, for instance approximately 30 sccm, and a flow rate of oxygen at approximately 100-140 sccm, for instance approximately 120 sccm. Based on the above etch parameters, the finally obtained size of the reduced spacers 225a, 225b may be adjusted by controlling the etch time. For example, with a spacer width of approximately 70 nm for the spacers 205a, 205b and for approximately 30 nm for the distance 211, an etch time of approximately 20-30 seconds results in an appropriate value in the range of 70-100 nm for the increased distance 211a. Based on the above etch parameters and with the specified etch time, a material removal within the metal-containing regions 215a, 215b is insignificant to the device performance and the further manufacture processes. In some embodiments, when even minute amounts of material removal within the metal-containing regions 215a, 215b may not be acceptable, the corresponding loss of material may be accounted for by correspondingly providing an increased initial height of the lines 204a, 204b. In other embodiments, the minute loss of material of the metal-containing regions 215a, 215b may be compensated for by correspondingly increasing the overall size of the metal-containing regions 215a, 215b, as will be described later on with reference to FIGS. 4a-4c.

It should be noted that the above process parameters for the etch process 220 may depend on the configuration of the etch tool, such as the chamber geometry, wherein, however, based on the above parameter ranges, corresponding process recipes for any other plasma etch tools may readily be deduced.

During the etch process 220, the liners 212a, 212b and the offset spacers 213a, 213b may also exhibit a significantly reduced removal rate compared to the material of the spacer elements, thereby at least partially acting as an etch stop layer for any exposed portions of the lines 204a, 204b and/or material of the semiconductor layer 210 adjacent to the metal-containing region 215. Any residues of exposed portions of the liners 212a, 212b and the offset spacers 213a, 213b may subsequently be removed by an isotropic wet chemical etch process, for instance on the basis of hydrofluoric acid (HF) when the liners 212a, 212b and the offset spacers 213a, 213b are comprised of silicon dioxide.

Figure 2C:
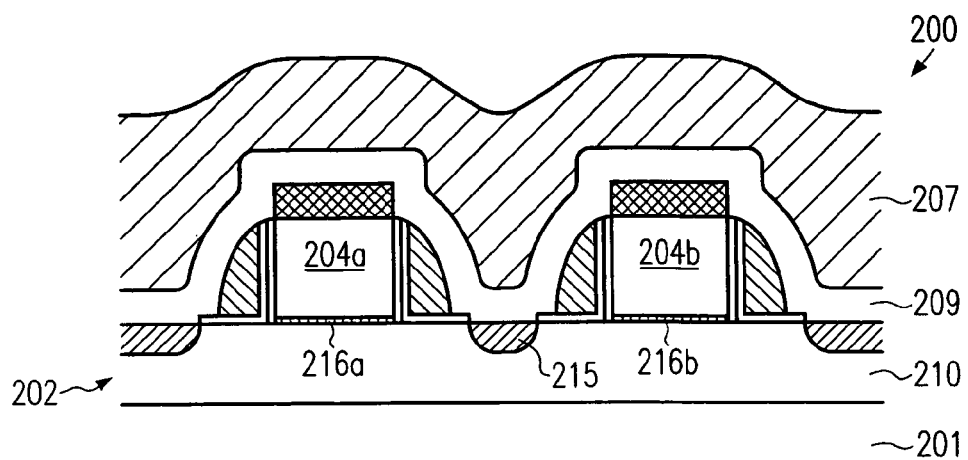

FIG. 2c schematically shows the semiconductor device 200 with an etch stop layer 209 comprised of, for instance, silicon nitride, formed on the structure 203 followed by an interlayer dielectric comprised of a layer 207 provided, in one embodiment, as silicon dioxide. As previously explained, the increased distance 211 a, resulting from the reduced spacer elements 225a, 225b, significantly relaxes the constraints imposed to the PECVD process for forming the etch stop layer 209 so that well-established deposition recipes may be used, possibly with minor adaptations, to provide a substantially void-free etch stop layer. Consequently, existing etch tools in combination with well-approved deposition recipes, as may currently be used for devices of the 130 nm technology for substrate diameters of 200 mm, may also be used for more advanced devices requiring critical design dimensions of 90 nm and less. In some embodiments, the well-established deposition recipes for silicon dioxide on the basis of PECVD from TEOS may further be used without significant changes, thereby providing the desired characteristics of the interlayer 207, especially in view of the subsequent CMP process. Consequently, after the formation of the interlayer dielectric 207, the surface of the structure may be planarized by chemical mechanical polishing, during which well-established process recipes may be used, and thereafter a photolithography may be performed to form contact openings through the interlayer dielectric 207 and the etch stop layer 209.

Figure 2D:
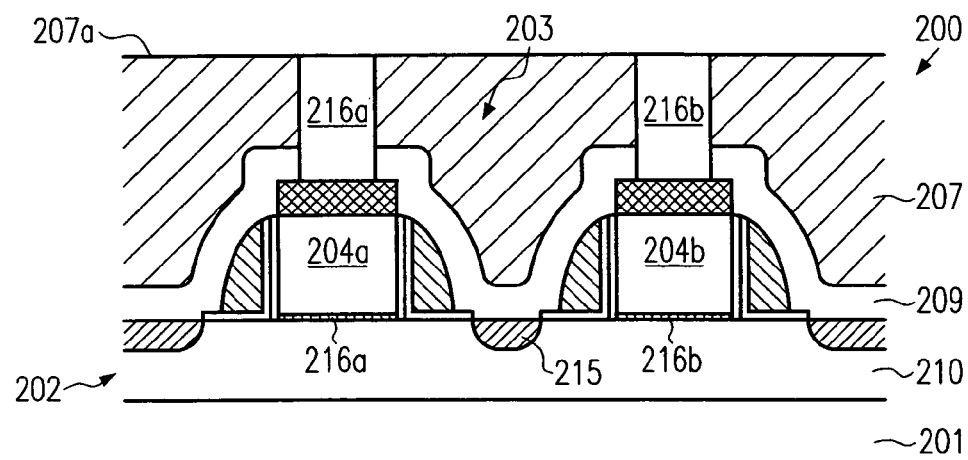

FIG. 2d schematically shows the semiconductor device 200 after the above-described process sequence. Thus, the device 200 comprises a substantially planarized surface 207a and respective contact openings 216a, 216b connecting to the respective lines 204a, 204b. It should be appreciated that, depending on the architecture of the structure 203, for instance depending on the transistor architecture, other contact openings may be formed that connect to the metal-containing region 215 or any other drain and source regions (not shown) of the structure 203.

As a result, by removing material of the sidewall spacers 205a, 205b immediately prior to the deposition of the etch stop layer 209, the aspect ratio of the spacing formed between the lines 204a, 204b is reduced, thereby allowing a substantially void-free deposition of the etch stop layer 209 and the interlayer dielectric 207.

Figure 3:
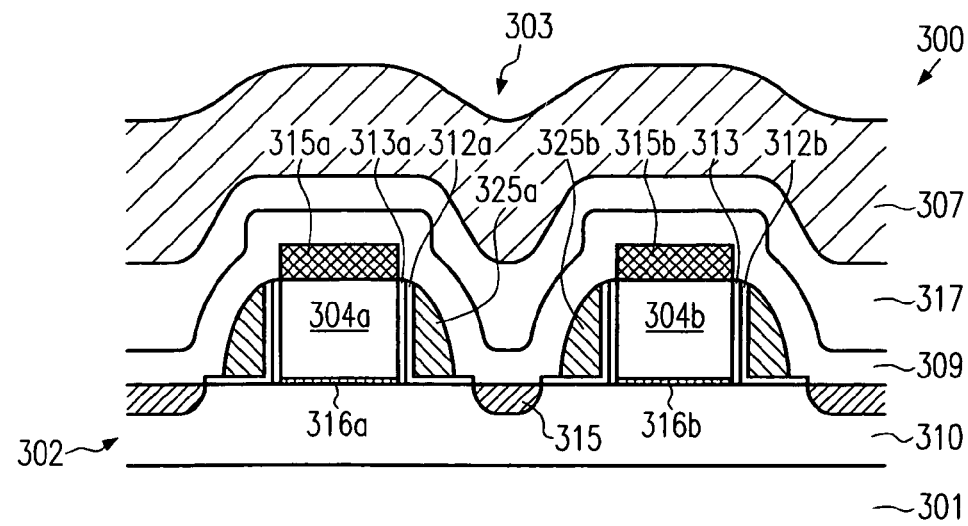
FIG. 3 schematically shows a semiconductor device during the formation of a dielectric interlayer on an etch stop layer, wherein a silicon dioxide bottom layer may be formed by a deposition technique with superior gap filling capabilities according to further embodiments of the present invention.

FIG. 3 schematically shows a semiconductor device 300 in a cross-sectional view, which is formed in accordance with further illustrative embodiments of the present invention. In FIG. 3, components that are identical or similar to components shown in FIGS. 2a-2d are denoted by the same reference signs except for a leading "3" instead of "2." For a detailed description of these components, it is referred to the embodiments described with reference to FIGS. 2a-2d. In this embodiment, the line structure 303, including the lines 304a, 304b is covered by the etch stop layer 309 followed by a first dielectric layer 317 and a second dielectric layer 307, which may be substantially identical to the interlayer dielectric 207 of FIGS. 2a-2d. The additional dielectric layer 317 may be comprised of a material that allows a deposition with enhanced gap filling capabilities. In one particular embodiment, the dielectric layer 317 is comprised of silicon dioxide the characteristics of which may differ from the characteristics of the dielectric layer 307 when comprised of silicon dioxide, due to a different deposition technique. Hereby, the dielectric layer 317 may be deposited by high density plasma enhanced CVD or by sub-atmospheric CVD, which both show superior gap filling capabilities and even a flow-like deposition behavior compared to the plasma enhanced CVD technique on the basis of TEOS, from which the dielectric layer 307 may be formed. Consequently, by depositing the dielectric layer 317 first, the requirements for the subsequent plasma enhanced CVD of the layer 307 are further relaxed, thereby even further improving the reliability of the process sequence with respect to the avoidance of voids within the etch stop layer 309 and/or the interlayer dielectric comprising the layers 317 and 307. Thus, in combination with the material removal of the sidewall spacers, thereby creating the reduced spacers 325a, 325b or creating the lines 304a, 304b substantially without any spacer elements, the deposition of the dielectric layer 317 having the superior gap filling capabilities, provides the potential of reliably forming etch stop layers and interlayer dielectrics on the device layer 302 on the basis of well-established recipes even for extremely scaled semiconductor devices.

Figure 4A:
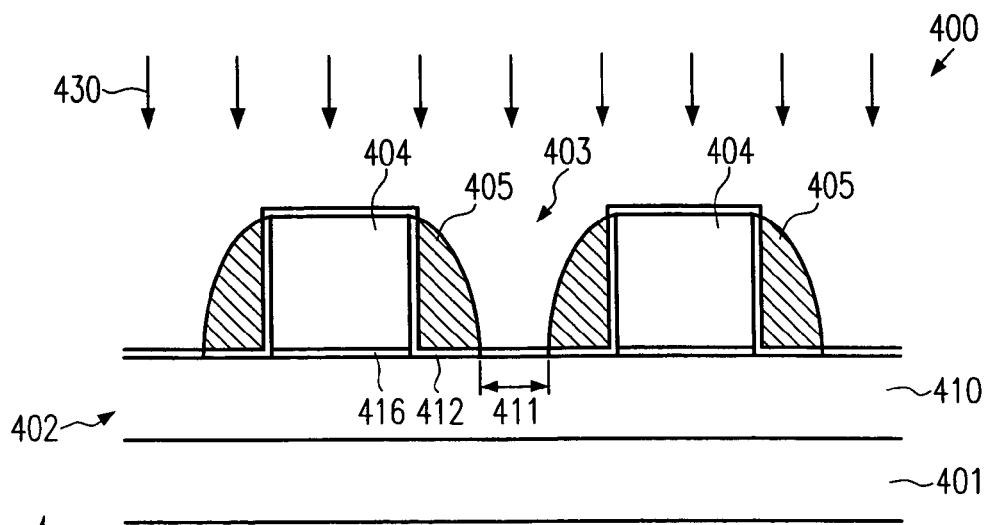
FIGS. 4a-4c schematically show a semiconductor device during various manufacturing stages in forming an etch stop layer and a dielectric interlayer, wherein spacer elements are reduced prior to and after the formation of metal-containing regions in accordance with further illustrative embodiments of the present invention.

FIG. 4a schematically shows a cross-sectional view of a semiconductor device 400 in accordance with further illustrative embodiments of the present invention. The device 400 comprises a substrate 401 having formed thereon a device layer 402 including a semiconductor layer 410 and a line structure 403. The line structure 403 may include a plurality of lines 404, such as polysilicon lines, each having formed on sidewalls thereof spacer elements 405. The lines 404 may be formed on respective insulating layers 416.

Regarding a process flow for forming the device 400 as shown in FIG. 4a, it is referred to corresponding process flows described with reference to FIGS. 1 and 2a. In particular, the sidewall spacers 405 may be formed to define a specified design distance 411 between adjacent lines 404, wherein the distance 411 in combination with the width of the spacers 405 is correspondingly designed to provide the required functionality. For instance, the lines 404 may represent gate electrodes of a transistor structure, wherein the spacers 405 may act as implantation masks during an ion implantation process 430. The ion implantation process 430 may be designed to establish a desired dopant concentration within the semiconductor layer 410 and the lines 404, wherein the line 404 in combination with the spacers 405 provide the desired lateral dopant profile.

Figure 4B:
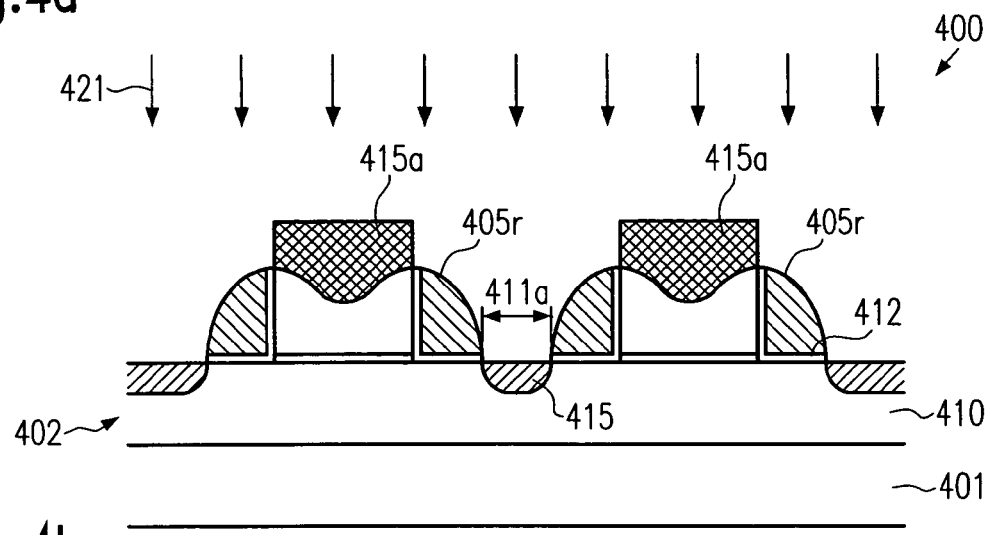

FIG. 4b schematically shows the device 400 in an advanced manufacturing stage, in which the device is subjected to a first etch process 421 for removing material of the spacers 405. In some embodiments, the etch process 421 may be performed as an anisotropic etch process with similar or identical etch parameters as are also used during the formation of the spacer elements 405, when an accordingly deposited spacer layer is subjected to an anisotropic etch process that finally results in the spacer elements 405. Hereby, the liner 412 (FIG. 4a) may still act as an etch stop layer to substantially avoid undue material removal of exposed portions of the lines 404 and the layer 410. The etch process 421 is further designed to leave behind reduced sidewall spacers 405r, the dimensions of which are selected to serve as a reaction mask in a subsequent silicidation process. To this end, the size of the spacers 405r may be related to a desired masking effect during the subsequent silicidation and, based on this relation, corresponding process parameters, such as the etch time, may be selected to arrive at the desired size of the spacers 405r.

FIG. 4b also shows metal-containing regions 415a in the lines 404 and a metal-containing region 415 in the semiconductor layer 410, which has substantially the dimensions as specified by an increased distance 411a defined by the reduced spacers 405r. The regions 415a and 415 may be formed by depositing a refractory metal and initiating a chemical reaction with the underlying material, wherein the spacers 405r act as a reaction mask having appropriate dimensions to avoid the formation of any conductive paths between the lines 404 or between the lines 404 and the region 415. Since an increased surface portion of the lines 404 is available for the chemical reaction, compared to the embodiments described above, an enlarged portion of the lines 404 may be converted into a highly conductive metal silicide, thereby improving the device performance and also compensating or even over-compensating any material loss that may occur during a subsequent further reduction of the spacers 405r.

It should be noted that, in some embodiments, the spacers 405r may be formed prior to the ion implantation 430, advantageously during the anisotropic etch process for forming the spacer elements 405. In this case, the etch process may be continued to immediately form the spacers 405r from a correspondingly deposited spacer layer, thereby enhancing the process efficiency. In this case, a corresponding relationship may be established between process parameters of the anisotropic etch process and a corresponding size of the spacers 405r to satisfy both the requirement for an appropriate implantation mask during the process 430 and the requirement for a reaction mask during the silicidation process. In this process strategy, an increased region 415a may be obtained compared to the embodiments described with reference to FIGS. 2a-2d, although the requirement for an appropriate implantation mask during the process 430 may possibly not allow as much a size reduction as may be possible in the embodiment shown in FIG. 4b. Irrespective of the process strategy for forming the spacers 405r, thereafter a further etch process may be performed, such as the etch process 220 (FIG. 2b) to further remove material of the spacers 405r or, in some embodiments, to substantially completely remove the spacers 405r.

Figure 4C:
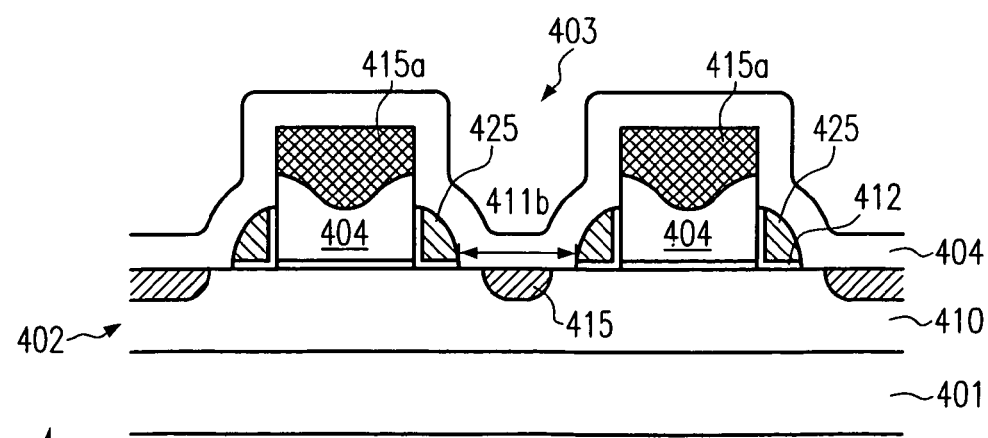

FIG. 4c schematically shows the device 400 in a further advanced manufacturing stage. The device 400 comprises reduced spacers 425 and an etch stop layer 409 that may be formed substantially without any voids between the spacing of the lines 404 due to a further increased distance 411b. Since the material removal for forming the reduced spacers 425 based on the etch process 220 starts with the spacers 405r having the reduced thickness compared to embodiments described with reference to FIGS. 2a-2d, a similar distance 411b corresponding to the distance 211a may be achieved with a significantly shorter etch time, thereby further reducing any material removal of the regions 415a and 415 during the etch process. On the other hand, for a given allowable material removal of the regions 415a, 415, a significantly increased distance 411b compared to 211a may be obtained, thereby further enhancing the reliability of the subsequent deposition process for forming the etch stop layer 409 substantially without any voids. In embodiments in which the reduced spacers 405r have to be removed substantially completely, the corresponding etch process may be performed without undue damage in the region 415a, 415 due to the significant size reduction of the spacers 405r, thereby not requiring an undue "over-etch" time owing to process non-uniformities. Consequently, by providing the spacers 405r having reduced dimensions prior to the formation of the metal-containing regions 415a, 415 in combination with a further material removal after the formation of the regions 415a, 415 and prior to the deposition of the etch stop layer 409, the efficiency of this deposition process and the subsequent deposition of any interlayer dielectric may even further be enhanced.

Thereafter, the further process sequence may be continued by depositing an interlayer dielectric, wherein a single deposition process or two or more deposition processes may be employed. That is, the further processing may be continued as is described with reference to FIGS. 2c and 2d or with reference to FIG. 3.

As a result, the present invention provides a technique that enables the formation of substantially void-free etch stop layers and interlayer dielectrics above the device layer of highly scaled integrated circuits, on the basis of well-established process recipes and process tools in that immediately prior to the deposition of the etch stop layer a significant amount of material is removed from the sidewall spacers, thereby effectively reducing the size thereof and thus increasing the effective space in between closely spaced lines. Particularly in combination with an enhanced deposition technique for depositing an interlayer dielectric, such as a deposition technique with superior gap filling capabilities in combination with a standard plasma enhanced deposition, and/or in combination with a further material removal of the sidewall spacers prior to the formation of metal silicide regions in the closely spaced lines, the overall efficiency of the inventive process strategy is significantly enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a structure above a substrate with a first line with a first spacer element formed on a sidewall thereof and a second line with a second spacer element formed on a sidewall thereof, said first and second spacer elements facing each other and defining a spacing therebetween;

forming a metal-containing region of increased conductivity on each of said lines using said first and second spacer elements as a reaction mask to cover at least a portion of said substrate during the forming of said metal-containing region;

removing material from said first and second spacer elements to increase said spacing after forming said metal containing region; and depositing an etch stop layer above said structure.

2. The method of claim 1, wherein said spacing is less than approximately 100 nm.

3. The method of claim 1, wherein said material of the first and second spacer elements is removed by an etch process having a reduced removal rate in said metal-containing region compared to said material of the first and second spacer elements.

4. The method of claim 3, wherein said etch process comprises a plasma etch process.

5. The method of claim 4, wherein said plasma etch process is performed with an etch chemistry on the basis of carbon monoxide (CO), a carbon/hydrogen/fluorine (CHF) compound and oxygen.

6. The method of claim 5, wherein said carbon/hydrogen/fluorine (CHF) compound comprises $CH_3F$.

7. The method of claim 1, wherein said first and second spacer elements are substantially completely removed.

8. The method of claim 1, further comprising depositing an interlayer dielectric on said etch stop layer.

9. The method of claim 8, further comprising forming a contact opening in said interlayer dielectric.

10. The method of claim 1, further comprising recessing said first and second spacer elements prior to forming said metal-containing region to expose a first portion of the sidewall of the first line and a second portion of the sidewall of the second line.

11. The method of claim 10, wherein recessing said first and second spacer elements comprises establishing a relationship between a degree of recess and a size of said metal-containing region and etching said first and second spacer elements on the basis of said relationship.

12. The method of claim 10, further comprising implanting a dopant species into said substrate while using said first and second lines and said first and second spacer elements as an implantation mask.

13. The method of claim 12, wherein implanting said dopant species is performed prior to recessing said first and second spacer elements.

14. The method of claim 12, wherein recessing said first and second spacer elements comprises establishing a relationship between a degree of recess and a size of said metal-containing region and a blocking effect required for said implantation of the dopant species, etching said first and second spacer elements on the basis of said relationship and implanting said dopant species while using said recessed first and second spacer elements as an implantation mask.

15. The method of claim 8, wherein forming said interlayer dielectric comprises depositing above said etch stop layer a first silicon dioxide layer by one of a thermal chemical vapor deposition process based on TEOS and a high density plasma chemical vapor deposition process.

16. The method of claim 15, wherein forming said interlayer dielectric further comprises depositing a second layer of silicon dioxide on said first layer by a plasma enhanced chemical vapor deposition process based on TEOS.

17. A method, comprising:
forming a structure above a substrate with a first line with a first spacer element formed on a sidewall thereof and a second line with a second spacer element formed on a sidewall thereof, said first and second spacer elements facing each other and defining a spacing therebetween;

forming a metal-containing region of increased conductivity on each of said lines using said first and second spacer elements as a reaction mask to cover at least a portion of said substrate during the forming of said metal-containing region;

removing material from said first and second spacer elements to increase said spacing by a selective etch process having a higher removal rate for said spacer material compared to said metal-containing region after forming said metal-containing region; and depositing an etch stop layer above said structure.

18. The method of claim 17, wherein said spacing is less than 100 nm.

19. The method of claim 18, wherein said spacing is approximately 30 nm or less.

20. The method of claim 17, wherein said etch process is a plasma etch process on the basis of carbon monoxide (CO), a carbon/hydrogen/fluorine (CHF) compound and oxygen.

21. The method of claim 15, wherein said carbon/hydrogen/fluorine (CHF) compound comprises $CH_3F$.

22. The method of claim 17, wherein said first and second spacer elements are substantially completely removed.

23. The method of claim 17, further comprising depositing an interlayer dielectric on said etch stop layer.

24. The method of claim 23, further comprising forming a contact opening in said interlayer dielectric.

25. The method of claim 17, further comprising recessing said first and second spacer elements prior to forming said metal-containing region to expose a first portion of the sidewall of the first line and a second portion of the sidewall of the second line.

26. The method of claim 25, wherein recessing said first and second spacer elements comprises establishing a relationship between a degree of recess and a size of said metal-containing region and etching said first and second spacer elements by controlling at least one etch parameter on the basis of said relationship.

27. The method of claim 17, further comprising implanting a dopant species into said substrate while using said first and second lines and said first and second spacer elements as an implantation mask.

28. The method of claim 27, wherein implanting said dopant species is performed prior to recessing said first and second spacer elements.

29. The method of claim 27, wherein recessing said first and second spacer elements comprises establishing a relationship between a degree of recess and a size of said metal-containing region and a blocking effect required for said implantation of the dopant species, etching said first and second spacer elements on the basis of said relationship and implanting said dopant species while using said recessed first and second spacer elements as an implantation mask.

30. The method of claim 23, wherein forming said interlayer dielectric comprises depositing above said etch stop layer a first silicon dioxide layer by one of a thermal chemical vapor deposition process based on TEOS and a high density plasma chemical vapor deposition process.

31. The method of claim 30, wherein forming said interlayer dielectric further comprises depositing a second layer of silicon dioxide on said first layer by a plasma enhanced chemical vapor deposition process based on TEOS.

* * * * *